United States Patent [19]

Freidin

[11] Patent Number: 4,835,414
[45] Date of Patent: May 30, 1989

[54] FLEXIBLE, RECONFIGURABLE TERMINAL PIN

[75] Inventor: Philip Freidin, Sunnyvale, Calif.

[73] Assignee: Advanced Micro Devices, Inc., Sunnyvale, Calif.

[21] Appl. No.: 167,670

[22] Filed: Mar. 14, 1988

[51] Int. Cl.$^4$ ............ H03K 17/16; H03K 17/04; H03K 3/013; H04Q 9/00

[52] U.S. Cl. ............ 307/243; 307/242; 307/475; 307/465; 364/716

[58] Field of Search ........... 307/240, 242, 243, 246, 307/465, 475, 592, 443, 445; 364/716; 340/825.02, 825.43

[56] References Cited

U.S. PATENT DOCUMENTS

| | | | |
|---|---|---|---|
| 4,479,067 | 10/1984 | Fujita | 307/475 |
| 4,621,202 | 11/1986 | Pumo | 307/242 |
| 4,695,740 | 9/1987 | Carter | 307/475 X |
| 4,703,198 | 10/1987 | Porter et al. | 307/475 X |
| 4,772,888 | 9/1988 | Kimura | 307/465 X |
| 4,774,422 | 9/1988 | Donaldson et al. | 307/243 X |

Primary Examiner—Stanley D. Miller
Assistant Examiner—David R. Bertelson

[57] ABSTRACT

A terminal pin (28) of an integrated circuit can be controlled in three ways to function as an input or an output pin. A logic circuit (16, 20, 23, 26) permits the pin to be synchronously enabled as an output terminal under software control. The circuit also permits the pin to be asynchronously enabled as an output terminal under control of a signal applied to another pin of the integrated circuit. The circuit also permits continuous control of the terminal as an output pin. Maskable bits stored in registers (18, 22) and configuration bits stored in register (25) affords additional flexibility in establishing which of the three ways the terminal pin wil be controlled.

10 Claims, 1 Drawing Sheet

FLEXIBLE, RECONFIGURABLE TERMINAL PIN

CROSS-REFERENCE TO RELATED, COPENDING APPLICATION

A related, copending application of particular interest to the present application is U.S. Ser. No. 07/167592, filed Mar. 14, 1988, on behalf of Bernard J. New et al. entitled BUS-COMPATIBLE PROGRAMMABLE SEQUENCER, and assigned to the assignee of the instant application.

FIELD OF THE INVENTION

This invention relates to a pin of an integrated circuit which can selectively operate as an input or an output pin and, more particularly, to a pin which can be synchronously controlled by an instruction, asynchronously controlled by a signal applied to the integrated circuit, and continuously controlled by a register.

BACKGROUND OF THE INVENTION

Because of the limitations imposed by packaging of integrated circuits, relatively few terminal pins are available to carry signals to and from the integrated circuit. It is imperative in many applications to make any given pin serve several functions. In some instances, a pin conducts an input signal, in another instance, a pin conducts an output signal. In another instances, a pin is to serve as both an input and an output terminal. The pin in the latter instance is deemed an output terminal, for example, but can be operated as input pin by assertion of a complemented output enable signal, by execution of an instruction, or by changing a configuration register.

In the prior art it has been possible to enable an output pin by either execution of an instruction (software) or by application of a signal at another pin of the integrated circuit (hardware).

However, since the former software enable is to be done synchronously, while the latter hardware enable is to be done asynchronously, the two methods have not both been available from a single pin.

In a state machine or a "sequencer", for example, it is desirable to permit enablement of a pin as an input or an output terminal either synchronously by software or asynchronously by hardware. This is because a sequencer is typically responsive both to an internal control program which is executed as a series of instructions, as well as to control signals applied externally by a microprocessor.

SUMMARY OF THE INVENTION

A circuit is provided by the instant invention which controls a terminal pin of an integrated circuit housing, in a preferred embodiment, a programmable sequencer. The circuit permits the pin to be synchronously enabled as an output terminal by execution of an instruction by the sequencer, asynchronously enabled as an output terminal by application of a signal at another pin of the integrated circuit, or continuously enabled as an input by the contents of a register.

DETAILED DESCRIPTION OF A PREFERRED EMBODIMENT

Figure 1:
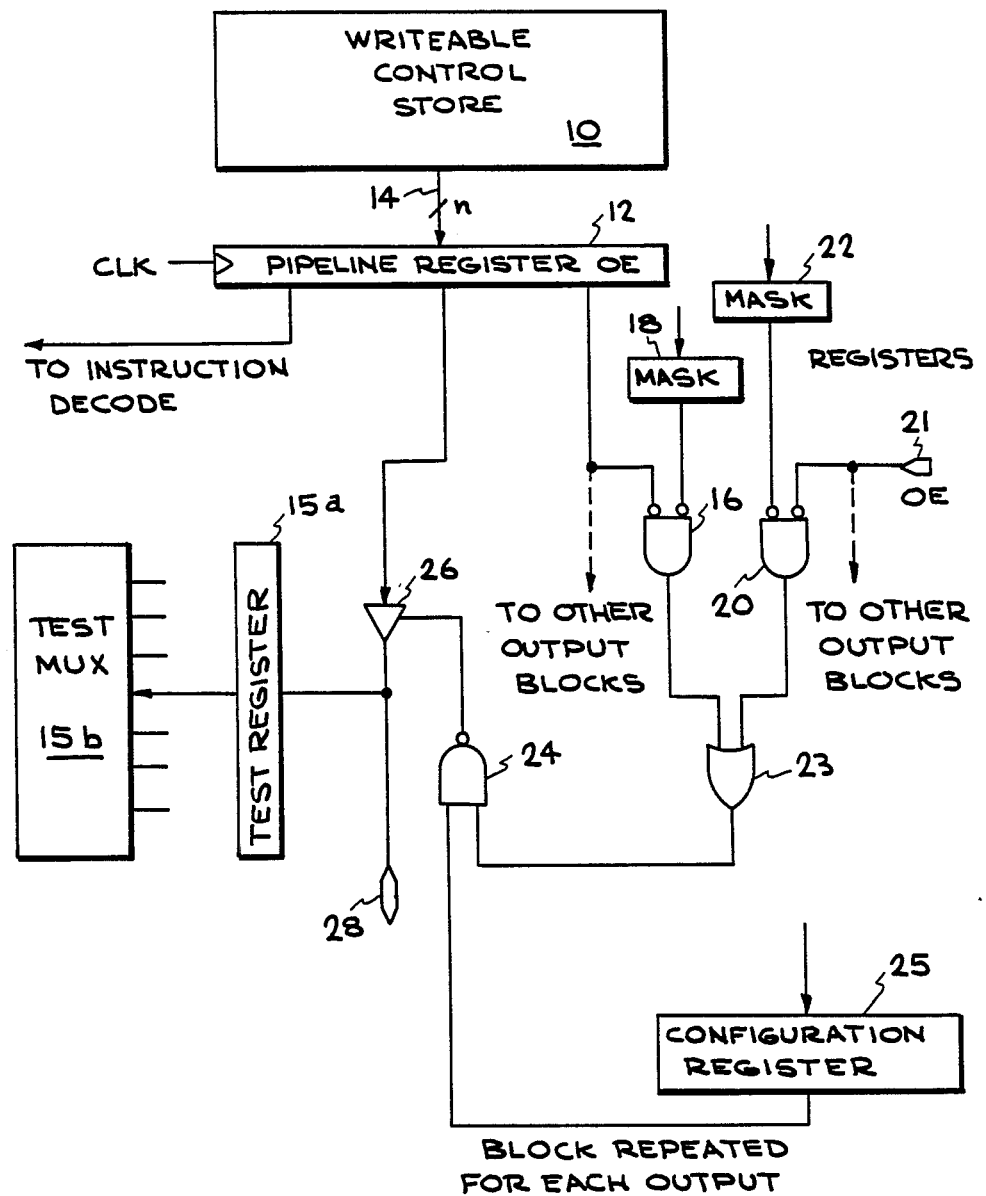
FIG. 1 is a logic diagram of a circuit controlling a terminal pin in accordance with the instant invention.

FIG. 1 is a logic diagram of a portion of a sequencer employing the pin control circuit of the instant invention. The sequencer includes a Writeable Control Store (WCS) 10 and a pipeline register 12 which is connected to an output of WCS 10 by a bus 14. The sequencer also includes a test register 15a and a test multiplexer (MUX) 15b. A sequencer containing such elements is described in the related, copending application BUS-COMPATIBLE PROGRAMMABLE SEQUENCER and such description is incorporated herein. Briefly, WCS 10 contains instructions which control operation of the sequencer, binary signals representing these instructions may be conducted on bus 14 to the pipeline register 12. A particular bit position in the instruction stored in register 12 will represent an output enable (OE) flag. Thus an instruction which is stored in WCS 10 and fetched for execution will be transferred to the pipeline register 12 and then conducted to an instruction decode block within the sequencer for execution. In accordance with the present invention, a signal may be applied at a terminal pin and conducted to a particular bit position of the test register 15a. The contents of this bit position may then be selected by Test MUX 15b and utilized by the instruction decode block. The elements shown in FIG. 1, as well as all other elements of the sequencer are preferably housed on an integrated circuit.

A clock (CLK), is applied to register 12 to synchronize transfer of signals therefrom. In particular, the OE signal is transferred synchronously to a complementing input of an AND gate 16. AND gate 16 also receives at another complementing input a signal from a particular bit position of a first mask register 18.

A second AND gate 20 receives at a complementing input an OE signal from an output enable pin 21 of the integrated circuit and at another complementing input a signal from a particular bit position of a second mask register 22. The output terminals of AND gates 16 and 20 are connected to input terminals of an OR gate 23. The output terminal of OR gate 23 is connected to an input terminal of a NAND gate 24. A signal from a particular bit position of a configuration register 25 is also conducted to another input terminal of NAND gate 24.

NAND gate 24 has its output terminal connected to the control terminal of a three-state buffer 26. The buffer 26 has an output connected to a pin 28 which can serve as either an input terminal or an output terminal of the integrated circuit housing the sequencer and the related elements shown in FIG. 1. Buffer 26 has an input terminal connected to a particular bit position of the pipeline register 12. If the output of NAND gate 24 causes buffer 26 to be in the driving mode, then the output of register 12 is driven onto pin 28 by buffer 26. If the output of NAND gate 24 causes buffer 26 to be in a Three-state mode, then pin 28 becomes an input that is available to Test Register 15a as described supra.

Pin 28 can be controlled by either application of an OE signal at pin 21 asynchronous to the sequencer CLK, causing AND gate 20 to generate a signal controlling buffer 26, or by reception at pipeline register 12 of an instruction having an OE bit of the proper level and upon synchronous transfer of the contents of register 12, AND gate 16 will generate a signal controlling buffer 26. The contents of configuration register 25 can unconditionally cause buffer 26 to be in a Three-state condition, allowing pin 28 to be used as an input terminal, as described supra.

The availability of maskable bits in registers 18 and 22, and the configuration bits in register 25 affords additional flexibility in the control of buffer 26 permitting three sets of conditions to be established; one for the synchronous software control of pin 28, one for the asynchronous hardware control of pin 28, and one for continuous control of pin 28.

It is understood by those skilled in the art that the logic circuitry shown in FIG. 1 is typically only one of many; each logic circuitry controlling one pin of perhaps sixteen which together form a connection to a sixteen-bit wide bus, each conductor of which is then selectively operable to conduct signals to the integrated circuit or from it in accordance with the invention.

What is claimed is:

1. In an integrated circuit having a pin (28) selectively configurable as an output or an input terminal, having means for synchronously generating a first signal indicative of said pin configuration and having means for asynchronously generating a second signal indicative of said pin configuration; pin configuration circuitry comprising:
    logic means (16, 20, 23) responsive to said first and second pin configuration signals for generating a control signal therefrom; and
    buffer means (26) responsive to said control signal for selectively configuring said pin as said input terminal or said output terminal.

2. In an integrated circuit according to claim 1 further including first means (18) for masking said first pin configuration signal.

3. In an integrated circuit according to claim 1 further including second means (22) for masking said second pin configuration signal.

4. In an integrated circuit according to claim 1 further including means for storing a plurality of instructions, register means receiving a synchronizing clock signal for receiving one of said instructions and for generating therefrom said first pin configuration signal.

5. In an integrated circuit according to claim 2 or 3 wherein said logic means comprises:

a first AND gate (16) receiving said first pin configuration signal and a first mask signal and generating therefrom a first masked pin configuration signal;
    a second AND gate (20) receiving said second pin configuration signal and a second mask signal and generating therefrom a second masked pin configuration signal; and
    an OR gate (23) receiving said first and second masked pin configuration signals and generating therefrom said control signal.

6. In an integrated circuit according to claim 1 further including means (25) for continuously generating a third pin configuration signal and wherein said logic means (16, 20, 23, 24) is further responsive to said third pin configuration signal.

7. In an integrated circuit according to claim 2, 3 or 6, wherein said logic means comprises:

a first AND gate (16) receiving said first pin configuration signal and a first mask signal and generating therefrom a first masked pin configuration signal;
    a second AND gate (20) receiving said second pin configuration signal and a second mask signal and generating therefrom a second masked pin configuration signal;
    an OR gate (23) receiving said first and second masked pin configuration signals and generating therefrom a signal; and
    a third AND gate (24) receiving said third pin configuration signal and said signal generated by said OR gate and generating therefrom said control signal.

8. In an integrated circuit according to claim 6 wherein said means for continuously generating said third pin configuration signal comprises a configuration register.

9. In an integrated circuit according to claim 1 further including means (15a) connected to said pin for generating a test signal, said buffer means further for conducting a signal applied to said pin to said test signal generating means.

10. In an integrated circuit according to claim 6 further including means (15a) connected to said pin for generating a test signal, said buffer means further for conducting a signal applied to said pin to said test signal generating means.

* * * * *

REEXAMINATION CERTIFICATE (1849th)
United States Patent [19]
Freidin

[11] B1 4,835,414

[45] Certificate Issued Nov. 17, 1992

[54] FLEXIBLE RECONFIGURABLE TERMINAL PIN

[75] Inventor: Philip Freidin, Sunnyvale, Calif.

[73] Assignee: Advanced Micro Devices, Inc., Sunnyvale, Calif.

Reexamination Request:
No. 90/002,572, Feb. 12, 1992

Reexamination Certificate for:
Patent No.: 4,835,414
Issued: May 30, 1989
Appl. No.: 167,670
Filed: Mar. 14, 1988

[51] Int. Cl.⁵ ............ H03K 17/16; H03K 17/04; H03K 3/013; H04Q 9/00
[52] U.S. Cl. .................... 307/243; 307/242; 307/465; 307/475; 364/716
[58] Field of Search ........... 307/465, 473, 475, 243, 307/242

[56] References Cited

U.S. PATENT DOCUMENTS

| | | | |
|---|---|---|---|
| 4,003,033 | 1/1977 | O'Keefe et al. | 395/325 |
| 4,099,229 | 7/1978 | Kancler | 395/375 |
| 4,128,873 | 12/1978 | Lamiaux | 395/325 |
| 4,130,869 | 12/1978 | Kinoshita et al. | 395/375 |
| 4,307,445 | 12/1981 | Tredennick et al. | 395/375 |
| 4,316,244 | 2/1982 | Grondalski | 395/425 |
| 4,320,453 | 3/1982 | Roberts et al. | 395/775 |
| 4,330,823 | 5/1982 | Retter | 395/375 |
| 4,347,566 | 8/1982 | Koda et al. | 395/800 |
| 4,367,524 | 1/1983 | Budde et al. | 395/375 |
| 4,403,287 | 9/1983 | Blahut et al. | 395/800 |
| 4,415,969 | 11/1983 | Bayliss et al. | 395/375 |
| 4,438,492 | 3/1984 | Harmon, Jr. et al. | 395/375 |
| 4,467,444 | 8/1984 | Harmon, Jr. et al. | 395/375 |
| 4,679,138 | 7/1987 | Epstein et al. | 395/375 |
| 4,680,491 | 7/1987 | Yokouchi et al. | 307/242 |
| 4,684,830 | 8/1987 | Tsui et al. | 307/465 |
| 4,701,920 | 10/1987 | Resnick et al. | 371/22.5 |
| 4,754,393 | 6/1988 | Kitson et al. | 395/375 |

FOREIGN PATENT DOCUMENTS

| | | |
|---|---|---|
| 0177268A3 | 4/1986 | European Pat. Off. . |
| 0188902A2 | 7/1986 | European Pat. Off. . |
| WO84/02988 | 8/1984 | PCT Int'l Appl. . |

OTHER PUBLICATIONS

*LSI Databook*, Sixth Edition, Monolithic Memories, Inc., 1978, USA, pp. 5-3 through 5-17, and pp. 5-24 and 5-74.
Specification Sheet for AM29PL141, dated Dec., 1985, by Advanced Micro Devices, Inc.
Specification Sheet for AM2900, dated 1979, by Advanced Micro Devices, Inc.
Article entitled "Using an Efficient Microarchitecture Achieves Goals", K. Burns et al., *Computer Designs*, vol. 23, No. 2, Feb. 1984, pp. 121-130.
Article entitled "Controller Mit PAL-Programming", O. Agrawal et al., *Elektronik*, vol. 35, No. 2, Jan. 1986, pp. 54-60.

*Primary Examiner*—John S. Heyman

[57] ABSTRACT

A terminal pin (28) of an integrated circuit can be controlled in three ways to function as an input or an output pin. A logic circuit (16, 20, 23, 26) permits the pin to be synchronously enabled as an output terminal under software control. The circuit also permits the pin to be asynchronously enabled as an output terminal under control of a signal applied to another pin of the integrated circuit. The circuit also permits continuous control of the terminal as an output pin. Maskable bits stored in registers (18, 22) and configuration bits stored in register (25) affords additional flexibility in establishing which of the three ways the terminal pin will be controlled.

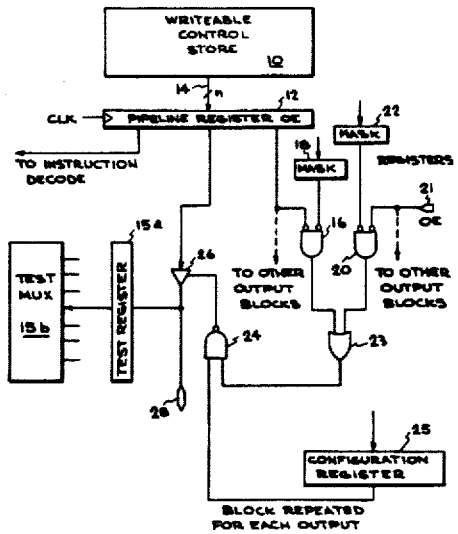

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-10 are determined to be patentable as amended.

New claims 11-20 are added and determined to be patentable.

1. [In an] *An* integrated circuit [having] *comprising:*
   a pin (28) selectively configurable as an output or an input terminal [, having];
   means *including means for receiving a synchronizing clock signal,* for synchronously generating a first signal indicative of said pin configuration; [and having]
   means for asynchronously generating a second signal indicative of said pin configuration; *and*
   pin configuration circuitry comprising:
      logic means (16, 20, 23) responsive to said first and second pin configuration signals for generating a control signal therefrom; and
      buffer means (26) responsive to said control signal for selectively configuring said pin as said input terminal or said output terminal.

2. [In an] *An* integrated circuit according to claim 1 further including first means (18) for masking said first pin configuration signal *so as to make said pin configurable as an input terminal or an output terminal independently of said first pin configuration signal.*

3. [In an] *An* integrated circuit according to claim 1 further including second means (22) for masking said second pin configuration signal *so as to make said pin configurable as an input terminal or an output terminal independently of said second pin configuration signal.*

4. [In an] *An* integrated circuit according to claim 1 further including means for storing a plurality of instructions, *wherein said means for receiving a synchronizing clock signal includes* register means receiving [a] *said* synchronizing clock signal for receiving one of said instructions and for generating therefrom said first pin configuration signal.

5. In an integrated circuit [according to claim 2 or 3] *having a pin (28) selectively configurable as an output or an input terminal, having means for synchronously generating a first signal indicative of said pin configuration and having means for asynchronously generating a second signal indicative of said pin configuration; pin configuration circuitry comprising:*
   logic means (16, 20, 23) responsive to said first and second pin configuration signals for generating a control signal therefrom;
   buffer means (26) responsive to said control signal for selectively configuring said pin as said input terminal or said output terminal; and
   first means (18) for masking said first pin configuration signal,
wherein said logic means comprises:
   a first AND gate (16) receiving said first pin configuration signal and a first mask signal and generating therefrom a first masked pin configuration signal;
   a second AND gate (20) receiving said second pin configuration signal and a second mask signal and generating therefrom a second masked pin configuration signal; and
   an OR gate (23) receiving said first and second masked pin configuration signals and generating therefrom said control signal.

6. [In an] *An* integrated circuit according to claim 1 further including means (25) for continuously generating a third pin configuration signal [and] *indicative of whether said pin is configured as an input terminal,* wherein said logic means (16, 20, 23, 24) is further responsive to said third pin configuration signal.

7. In an integrated circuit [according to claim 2, 3, or 6,] *having a pin (28) selectively configurable as an output or an input terminal, having means for synchronously generating a first signal indicative of said pin configuration and having means for asynchronously generating a second signal indicative of said pin configuration; pin configuration circuitry comprising:*
   logic means (16, 20, 23) responsive to said first and second pin configuration signals for generating a control signal therefrom;
   buffer means (26) responsive to said control signal for selectively configuring said pin as said input terminal or said output terminal; and
   first means (18) for masking said first pin configuration signal,
wherein said logic means comprises:
   a first AND gate (16) receiving said first pin configuration signal and a first mask signal and generating therefrom a first masked pin configuration signal;
   a second AND gate (20) receiving said second pin configuration signal and a second mask signal and generating therefrom a second masked pin configuration signal;
   an OR gate (23) receiving said first and second masked pin configuration signals and generating therefrom a signal; and
   a third AND gate (24) receiving [said] *a* third pin configuration signal and said signal generated by said OR gate and generating therefrom said control signal.

8. [In an] *An* integrated circuit according to claim 6 wherein said means for continuously generating said third pin configuration signal comprises a configuration register.

9. [In an] *An* integrated circuit according to claim 1 further including means (15a) connected to said pin for generating a test signal, said buffer means further for conducting a signal applied to said pin to said test signal generating means.

10. [In an] *An* integrated circuit according to claim 6 further including means (15a) connected to said pin for generating a test signal, said buffer means further for conducting a signal applied to said pin to said test signal generating means.

*11. An integrated circuit according to claim 6 wherein said means (25) for generating said third pin configuration* signal can unconditionally configure said pin as an input terminal.

12. An integrated circuit according to claim 1 which integrated circuit comprises a sequencer, wherein:
   said sequencer comprises a store for containing instructions for controlling said sequencer, and
   said first pin configuration signal is generated from an instruction provided by said store.

13. An integrated circuit according to claim 12 further comprising a pipeline register for storing an instruction provided by said store,
   wherein said first pin configuration signal is generated from an instruction stored in said pipeline register.

14. An integrated circuit according to claim 12 wherein said first pin configuration signal is generated from a predetermined bit of an instruction provided by said store.

15. An integrated circuit according to claim 12 wherein said sequencer further comprises:
   an instruction decode block for executing instructions provided by said store; and
   means for providing to said instruction decode block an input signal which is received at said pin when said pin is configured as an input terminal.

16. An integrated circuit according to claim 1 which integrated circuit comprises a sequencer, wherein said sequencer comprises:
   means for providing instructions for controlling operation of said sequencer;
   an instruction decode block for executing said instructions; and
   means for providing to said instruction decode block an input signal which is received at said pin when said pin is configured as an input terminal.

17. An integrated circuit according to claim 1 wherein:
   when said pin is configured as an output terminal, said buffer means is in a driving mode to drive an output signal on said pin, and
   when said pin is configured as an input terminal, said buffer means is in a three-state mode.

18. In an integrated circuit having a pin (28) selectively configurable as an output or an input terminal, having means for synchronously generating a first signal indicative of said pin configuration and having means for asynchronously generating a second signal indicative of said pin configuration; pin configuration circuitry comprising:
   logic means (16, 20, 23) responsive to said first and second pin configuration signals for generating a control signal therefrom;
   buffer means (26) responsive to said control signal for selectively configuring said pin as said input terminal or said output terminal; and
   second means (22) for masking said second pin configuration signal,
wherein said logic means comprises:
   a first AND gate (16) receiving said first pin configuration signal and a first mask signal and generating therefrom a first masked pin configuration signal;
   a second AND gate (20) receiving said second pin configuration signal and a second mask signal and generating therefrom a second masked pin configuration signal; and
   an OR gate (23) receiving said first and second masked pin configuration signals and generating therefrom said control signal.

19. In an integrated circuit having a pin (28) selectively configurable as an output or an input terminal, having means for synchronously generating a first signal indicative of said pin configuration and having means for asynchronously generating a second signal indicative of said pin configuration; pin configuration circuitry comprising:
   logic means (16, 20, 23) responsive to said first and second pin configuration signals for generating a control signal therefrom;
   buffer means (26) responsive to said control signal for selectively configuring said pin as said input terminal or said output terminal; and
   second means (22) for masking said second pin configuration signal,
wherein said logic means comprises:
   a first AND gate (16) receiving said first pin configuration signal and a first mask signal and generating therefrom a first masked pin configuration signal;
   a second AND gate (20) receiving said second pin configuration signal and a second mask signal and generating therefrom a second masked pin configuration signal;
   an OR gate (23) receiving said first and second masked pin configuration signals and generating therefrom a signal; and
   a third AND gate (24) receiving a third pin configuration signal and said signal generated by said OR gate and generating therefrom said control signal.

20. In an integrated circuit having a pin (28) selectively configurable as an output or an input terminal, having means for synchronously generating a first signal indicative of said pin configuration and having means for asynchronously generating a second signal indicative of said pin configuration; pin configuration circuitry comprising:
   logic means (16, 20, 23) responsive to said first and second pin configuration signals for generating a control signal therefrom;
   buffer means (26) responsive to said control signal for selectively configuring said pin as said input terminal or said output terminal; and
   means (25) for continuously generating a third pin configuration signal,
wherein said logic means is further responsive to said third pin configuration signal, and
wherein said logic means comprises:
   a first AND gate (16) receiving said first pin configuration signal and a first mask signal and generating therefrom a first masked pin configuration signal;
   a second AND gate (20) receiving said second pin configuration signal and a second mask signal and generating therefrom a second masked pin configuration signal;
   an OR gate (23) receiving said first and second masked pin configuration signals and generating therefrom a signal; and
   a third AND gate (24) receiving said third pin configuration signal and said signal generated by said OR gate and generating therefrom said control signal.

* * * * *